United States Patent
Meninger et al.

(10) Patent No.: US 7,327,820 B2
(45) Date of Patent: Feb. 5, 2008

(54) METHOD AND APPARATUS FOR REDUCING QUANTIZATION NOISE IN FRACTIONAL-N FREQUENCY SYNTHESIZERS

(75) Inventors: Scott Edward Meninger, Somerville, MA (US); Michael Henderson Perrott, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 768 days.

(21) Appl. No.: 10/701,732

(22) Filed: Nov. 5, 2003

(65) Prior Publication Data

US 2005/0094757 A1 May 5, 2005

(51) Int. Cl.
*H03D 3/24* (2006.01)
(52) U.S. Cl. ..................................... 375/376
(58) Field of Classification Search ............. 375/327, 375/376; 327/144–150, 155–159; 331/10–12
See application file for complete search history.

(56) References Cited

U.S. PATENT DOCUMENTS

| | | | | |
|---|---|---|---|---|
| 5,521,948 | A * | 5/1996 | Takeuchi | 375/376 |
| 6,130,561 | A | 10/2000 | Dufour | |
| 6,553,089 | B2 * | 4/2003 | Huh et al. | 375/376 |
| 2001/0052804 | A1 * | 12/2001 | Hasegawa | 327/156 |
| 2002/0136342 | A1 * | 9/2002 | Lee et al. | 375/376 |
| 2002/0140512 | A1 * | 10/2002 | Stockton | 331/11 |

OTHER PUBLICATIONS

Lee, K., et al.; "A Single-Chip 2.4GHz Direct-Conversion CMOS . . . "; IEEE Journal of Solid-State Circuits; vol. 36; No. 5; pp. 800-809; May 2001.
Park, et al.; "A 1.8 GHz Self-Calibrated Phase-Locked Loop with . . . "; IEEE Journal of Sold-State Circuits; vol. 36; No. 5; pp. 777-783; May 2001.
Rhee, W. et al.; "An On-Chip Phase Compensation Technique in Fractional-N Frequency Synthesis"; Conexant Systems, Inc.; IEEE; pp. 363-366; 1999.
Riley, T. et al.; "A Hybrid . . . Fractional-N Frequency Synthesis"; Proceedings of the 1999 IEEE ISCAS; vol. 3; pp. 176-180; Apr. 2003.

\* cited by examiner

*Primary Examiner*—Don N. Vo
(74) *Attorney, Agent, or Firm*—Guerin & Rodriguez, LLP; William G. Guerin

(57) ABSTRACT

Described are methods and modules for reducing the phase noise generated in a fractional-N frequency synthesizer. The methods are based on swapping phase signals to achieve the same average delay for each phase signal path, compensation and resynchronization of phase signals and shuffling of digital-to-analog unit elements used to produce specific quantization levels. One method is based on digital gain compensation used to correct for frequency-dependent error arising from differences between horizontal slicing quantization techniques and conventional vertical slicing techniques. Also described are a combined phase detector and DAC module and a method for extending its range.

11 Claims, 7 Drawing Sheets

METHOD AND APPARATUS FOR REDUCING QUANTIZATION NOISE IN FRACTIONAL-N FREQUENCY SYNTHESIZERS

FIELD OF THE INVENTION

The invention relates generally to technology for reducing phase noise in frequency synthesizers. In particular, the invention relates to an apparatus and method based on combining phase detection and digital-to-analog conversion to cancel quantization-induced phase noise.

BACKGROUND

Frequency synthesizers are in wide use for a variety of applications. For example, frequency synthesizers are used in radio frequency (RF) systems to generate a local oscillator signal or for direct modulation of a transmission signal. Generally, frequency synthesizers employ a phase-lock loop (PLL) circuit having a voltage controlled oscillator (VCO) and a divider. The VCO output signal is divided according to an integer value and compared with a reference signal. The resulting error signal is filtered and applied to the VCO. The synthesizer resolution is dependent on the bandwidth of the synthesizer.

Unlike integer-based frequency synthesizers, fractional-N frequency synthesizers make the choice of synthesizer resolution independent of bandwidth. Referring to FIG. 1, a typical fractional-N frequency synthesizer 10 includes a phase-frequency detector (PFD, generally phase detector) 14 in communication with a summing node 18, a loop filter 22, a VCO 26, and an integer-based divider 30. The divider 30 is also in communication with an accumulator 34. The accumulator 34 is in communication with a digital to analog converter module (DAC) 38 that is coupled to the summing node 18. Based on the required fractional value F and the divider signal DIV, the accumulator 30 sends a carry out signal CO to the divider 30 to dither the instantaneous divider integer value, resulting in a fractional average divider value. The accumulator 30 also provides a residue signal RES to the DAC 38 which generates an output signal DACOUT. The DAC output signal DACOUT is summed with the phase error signal E to compensate for the periodic structure of the phase error signal E resulting from the phase difference between the divider signal DIV and the reference signal REF.

The "phase interpolation" method described above is limited by the ability of the synthesizer 10 to match the DAC output signal DACOUT and the phase error signal E. FIG. 2 graphically illustrates the signals generated and utilized by the synthesizer 10 of FIG. 1 for a case in which the synthesizer 10 is locked and the average divider value is 4.75. In this example, the carry out signal CO is used to dither the divider integer between 4 and 5. The phase error E resulting from the difference of the reference signal REF and the divider signal DIV is periodic and correlates with the cyclic nature of the divider integer value. The phase error E causes fractional spurs in the synthesizer output spectrum at low sideband frequencies. The residue signal RES from the accumulator 34 "tracks" the phase error E and is used to control the DAC 38 so that the DAC output signal DACOUT compensates for the periodic component of the phase error E. Unfortunately, gain matching the DAC output signal DACOUT and the phase error signal E is difficult because the signals DACOUT, E are generated by separate circuit elements. The gain mismatch occurs in both magnitude and time. Consequently, the typical spurious performance achieved using this method is unacceptable for many high performance RF local oscillator applications.

$\Sigma\Delta$ fractional-N frequency synthesizers achieve improved spurious performance by modulating the divider integer value. Quantization noise realized by dithering the divider integer value is randomized (whitened), and shaped to high frequencies so that it is substantially removed by the loop filter 22. However, shaped quantization noise can dominate at intermediate to high offset frequencies. As a result, low phase-noise frequency synthesizers generally have low closed loop bandwidths. This noise-bandwidth tradeoff is contrary to the goal of increased synthesizer bandwidth for fractional-N frequency synthesizers.

Different approaches have been adopted to reduce the impact of the noise-bandwidth tradeoff. Multiple VCO signal phases or divider output signal phases can be used to reduce the quantization step size. However, the number of phases is limited, for example, by gate delays which can be a significant portion of the period of the VCO signal. Moreover, to generate the multiple phases, either a ring oscillator or a delay lock loop (DLL) is typically used, and special attention must be directed to potential phase mismatches between the signal phases. In another approach a $\Sigma\Delta$ digital to analog converter ($\Sigma\Delta$ DAC) is employed to reduce the effect of DAC nonlinearity. Gain matching the $\Sigma\Delta$ DAC output signal and the phase error signal E is difficult because the signals are generated by separate circuits. In addition, to achieve desirable performance, a high resolution DAC is required. Although wideband phase noise levels can be reduced using this technique, the spurious performance is similar to that obtained using other fractional-N frequency synthesizers.

U.S. Pat. No. 6,130,561 describes another technique in which a hybrid charge pump and PFD structure compensates for the phase error between the divider signal DIV and the reference signal REF. The combination of functions in a single hybrid circuit results in a better gain match between the phase error E and the DAC cancellation signals. However, the hybrid structure does not accommodate the mismatch between discrete elements in the DAC, or between the timing signals in the phase detectors, thus there is incomplete phase error signal cancellation and no significant difference in spurious performance.

Thus there remains a need for a fractional-N frequency synthesizer having improved matching between the cancellation DAC output signal and phase error signal. The present invention satisfies this need and provides additional advantages.

SUMMARY OF THE INVENTION

The invention seeks to address at least some of the unmet needs above. In one aspect the invention features a method for reducing the phase noise generated by relative propagation delay in a fractional-N frequency synthesizer having a first phase detector and a second phase detector. The method includes generating a swap signal having a first state and a second state, providing a first phase signal to a first phase detector and a second phase signal to a second phase detector when the swap signal is in the first state, and providing the first phase signal to the second phase detector and the second phase signal to the first phase detector when the swap signal is in the second state.

In another aspect the invention features a compensation and resynchronization module for a fractional-N frequency synthesizer having a first multiplexer and a second multiplexer. Each multiplexer is configured to provide one of a first phase signal and a second phase signal in response to a swap signal. The first multiplexer provides the first phase signal and the second multiplexer provides the second phase signal when the swap signal is in a first state. Conversely, the first multiplexer provides the second phase signal and the second multiplexer provides the first phase signal when the swap signal is in a second state.

In another aspect the invention features a digital gain compensation module for a fractional-N frequency synthesizer. The digital gain compensation module includes a memory module having an input terminal to receive at least a portion of residue bits generated by an accumulator. The memory module stores a lookup table having a plurality of compensation values. Each compensation value is associated with a respective value defined by the portion of residue bits. The memory module provides an output value in response to the portion of residue bits. The digital gain compensation module also includes a discrete time differentiator in communication with the memory module. The discrete time differentiator is configured to generate a differentiated signal responsive to the output value of the memory module. In another embodiment the memory module is replaced by a processor module. The processor module has a first input terminal to receive at least a portion of the residue bits generated by the accumulator and a second input terminal to receive a nominal divide value. The processor module generates an output value responsive to the portion of residue bits and the nominal divide value.

In another aspect the invention features a method for reducing the phase noise in a fractional-N frequency synthesizer. The method includes determining a residue value generated by an accumulator, determining an approximation of a frequency-dependent gain error value, and summing the approximation of the frequency-dependent gain error value and the residue value to generate a digital control signal.

In another aspect the invention features a method for extending the range of a combined phase detector and digital-to-analog conversion structure (PFD/DAC) in a fractional-N frequency synthesizer. The method includes dividing a voltage controlled oscillator (VCO) signal by one of an integer and one more than the integer based on a predetermined fractional value, generating at a first time a first current responsive to a phase error between a reference signal and a divided VCO signal, and generating at a second time a second current responsive to a phase error between the reference signal and a delayed divided VCO signal. The method also includes generating a first sum current by adding a first predetermined bias current to the first current, generating a second sum current by adding a second predetermined bias current to the second current, and combining the first and second sum currents.

In another aspect the invention features a method for reducing the phase noise in a fractional-N frequency synthesizer having a PFD/DAC. The method includes sampling a current generated in the PFD/DAC at a sampling rate substantially equal to a frequency of a reference signal used to determine a phase error. Sampling occurs at the end of each reference cycle.

In another aspect the invention features a method for reducing the phase noise in a fractional-N frequency synthesizer. The method includes determining a number of DAC elements to generate a DAC signal at a first quantization level, generating the DAC signal at the first quantization level using a first set of DAC elements and generating the DAC signal at the first quantization level using a second set of DAC elements. The first and second sets of DAC elements each include the same number of DAC elements but have different combinations of DAC elements.

In another aspect the invention features a PFD/DAC for a fractional-N frequency synthesizer. The PFD/DAC includes a master charge pump and a current source module. The master charge pump has a first pump section and a second pump section. The current source module provides an initial current to the first pump section at a first time and provides a remainder current to the second pump section at a second time. The initial current is responsive to an accumulator residue signal and the remainder current is responsive to the difference of the initial current and a predetermined constant current.

In another aspect the invention features a PFD/DAC for a fractional-N frequency synthesizer. The PFD/DAC includes a current switching module and a voltage source module. The current switching module includes a first switch section and a second switch section. The voltage source module provides an initial current to the first switch section at a first time and provides a remainder current to the second switch section at a second time. The initial current is responsive to an accumulator residue signal and the remainder current is equal to the difference of the initial current and a predetermined constant current.

BRIEF DESCRIPTION OF THE DRAWINGS

The above and further advantages of this invention may be better understood by referring to the following description in conjunction with the accompanying drawings, in which like numerals indicate like structural elements and features in the various figures. Primed numerals identify structural elements and features which are similar, but not necessarily identical, to structural elements and features designated by unprimed numerals. The drawings are not necessarily to scale, emphasis instead being placed upon illustrating the principles of the invention.

DETAILED DESCRIPTION

Figure 1:
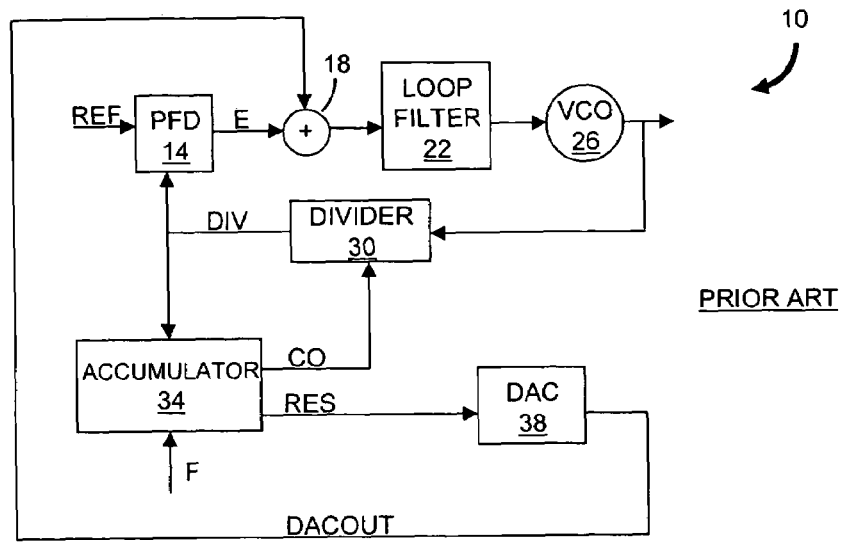
FIG. 1 is a schematic block diagram of a fractional-N frequency synthesizer as known in the art.
Figure 2:
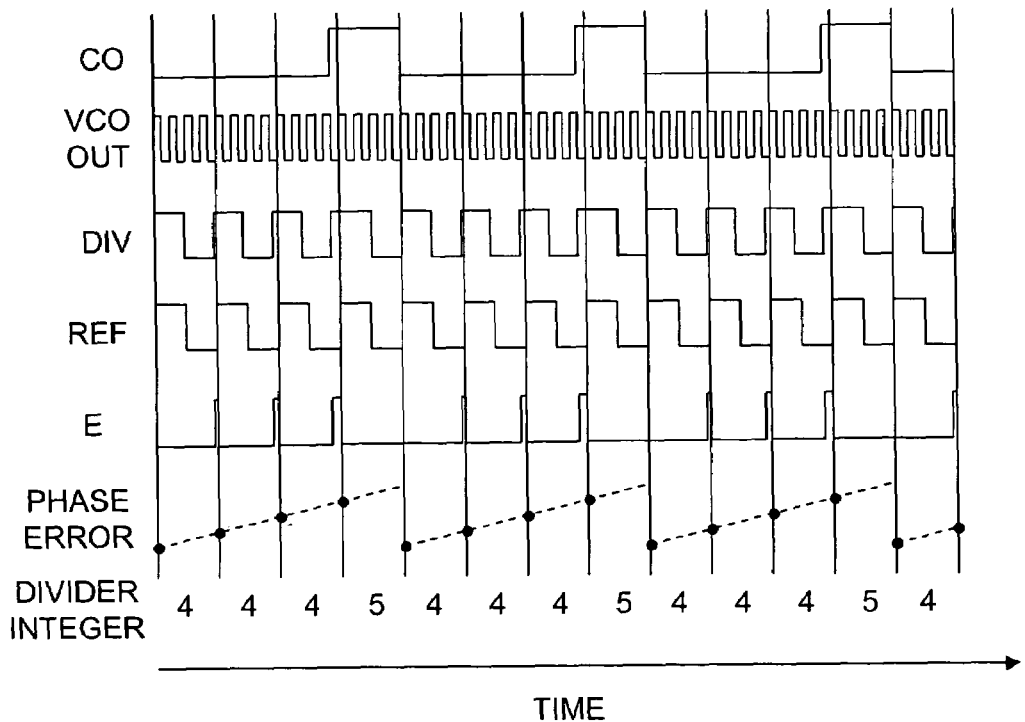
FIG. 2 is a graphical representation of electrical signals generated or processed by the frequency synthesizer of FIG. 1 as a function of time.
Figure 3:
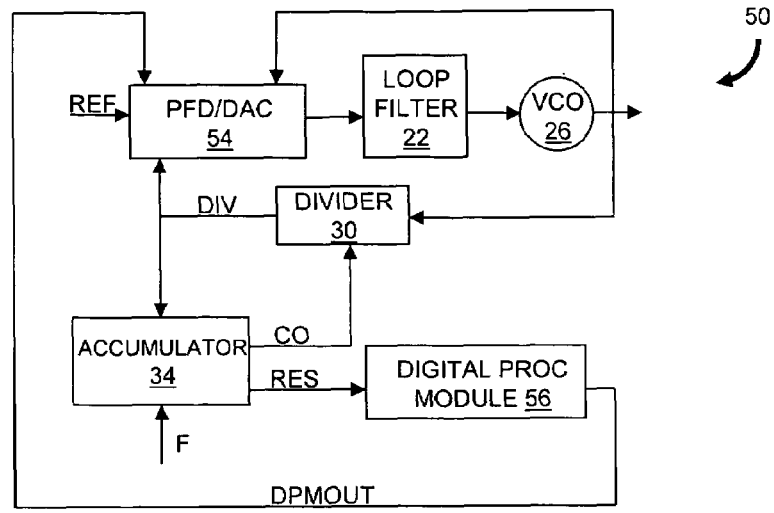
FIG. 3 is a schematic block diagram of a fractional-N frequency synthesizer constructed in accordance with at least one embodiment of the invention.

Referring to FIG. 3, an embodiment of a fractional-N frequency synthesizer 50 constructed according to the invention includes many of the elements of the frequency synthesizer 10 of FIG. 1. The functionalities of the PFD 14 and the DAC 38 are provided by a single PFD/DAC structure 54 which substantially reduces gain mismatch between the DAC output signal DACOUT and the phase error signal E present in the frequency synthesizer 10 of FIG. 1. A digital processing module (DPM) 56 communicates with the accumulator 34 and the PFD/DAC 54. The DPM 56 receives the accumulator residue signal RES and provides an output signal DPMOUT to the PFD/DAC 54. Processing includes implementation of digital $\Sigma\Delta$ modulation and can include digital gain compensation and randomization (i.e., shuffling) of unit elements as described below.

Figure 4:
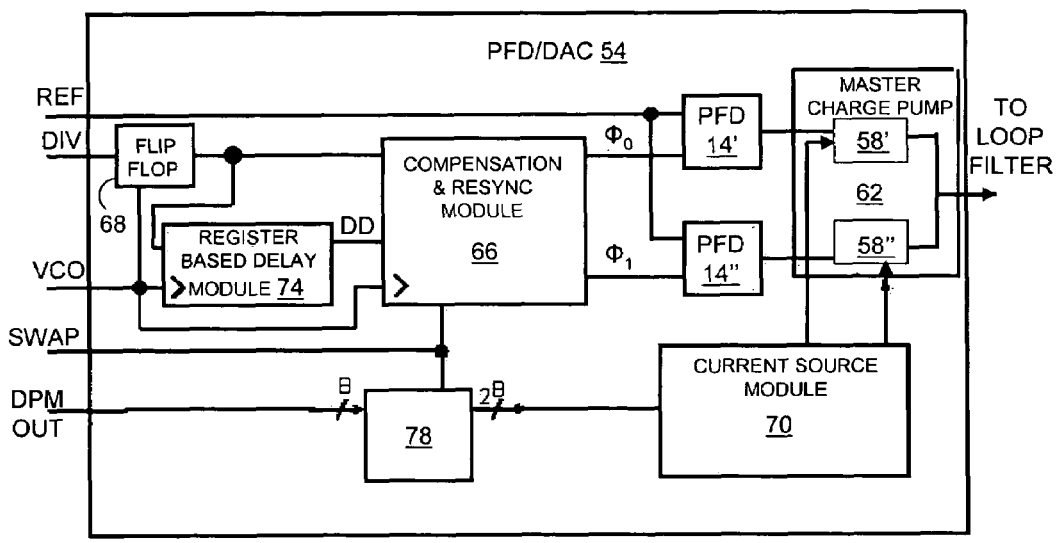
FIG. 4 is a schematic block diagram of an embodiment of the PFD/DAC of FIG. 3 in accordance with the invention.

FIG. 4 illustrates in more detail an embodiment of the PFD/DAC 54 of FIG. 3 in accordance with the invention. The PFD/DAC 54 includes a first phase detector 14' in communication with a first pump section 58' of a master charge pump 62 and a second phase detector 14" in communication with a second pump section 58" of the master charge pump 62. Both phase detectors 14 communicate with a compensation and resynchronization module 66. A flip-flop 68 is included to resynchronize the divider signal DIV to the VCO signal. Both pump sections 58 communicate with a current source module 70. The use of only two signal paths in the PFD/DAC 54 substantially reduces the potential for mismatch.

In operation, the compensation and resynchronization module 66 receives the divider signal DIV at one input terminal and a delayed divider signal DD from a register based delay module 74 at a second input terminal. Both signals DIV and DD pass through the compensation and resynchronization module 66 which accommodates timing differences, or mismatches, in the phase signal paths. The resulting output phase signals $\Phi_0$ and $\Phi_1$ are compared to the reference signal REF by the respective phase detectors 14 which control the master charge pump 62. The output of the digital processing module (see FIG. 3) is provided to a DAC mismatch shaping module 78 which accounts for errors in the elements that supply the master charge pump 62 (explained in more detail below).

Figure 5:
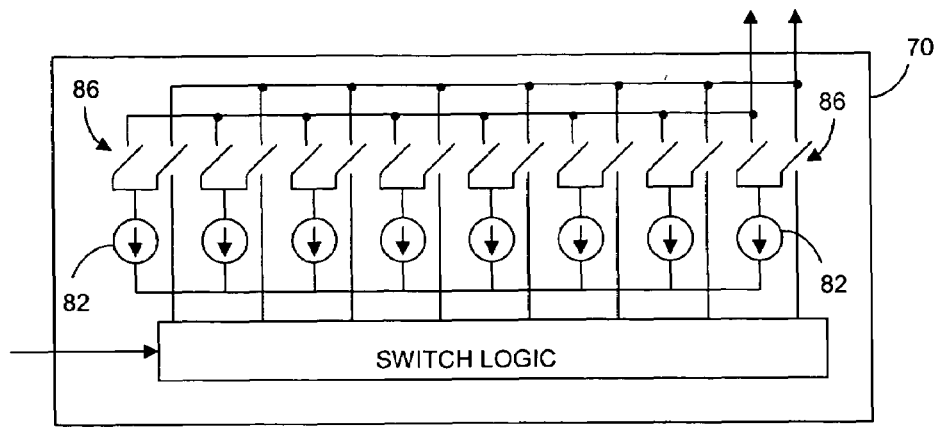
FIG. 5 is a schematic block diagram of an embodiment of the current source module of the PFD/DAC of FIG. 4 in accordance with the invention.

FIG. 5 shows an embodiment of the current source module 70 of the PFD/DAC 54 of FIG. 4. The current source module 70 includes a plurality of current sources 82 each coupled to a respective switch 86 to direct current to either the first pump section 58' or the second pump section 58" of the master charge pump 62. A control signal provided by the DAC mismatch shaping module 78 determines the state of each switch 86 so that a portion, or subset, of the current sources 82 is used provide an initial current to the first pump section 58' at a first time. After the expiration of one (or more) VCO periods, the switches 86 for the remaining current sources 82 change state so that a remainder current is applied to the second pump section 58". A more detailed explanation of the quantization achieved in this manner is provided below.

Figure 6:
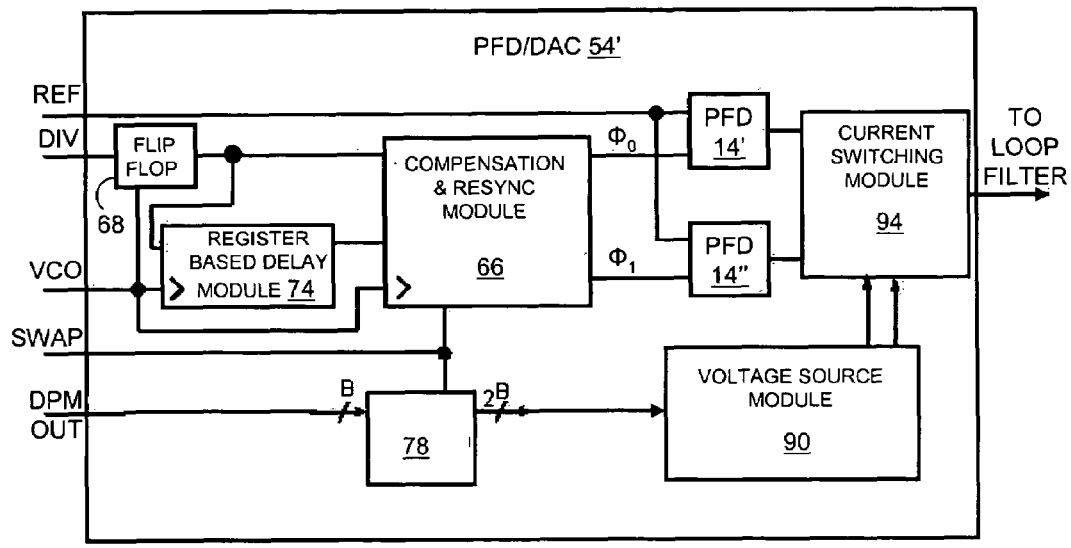
FIG. 6 is a schematic block diagram of another embodiment of the PFD/DAC of FIG. 3 in accordance with the invention.
Figure 7:
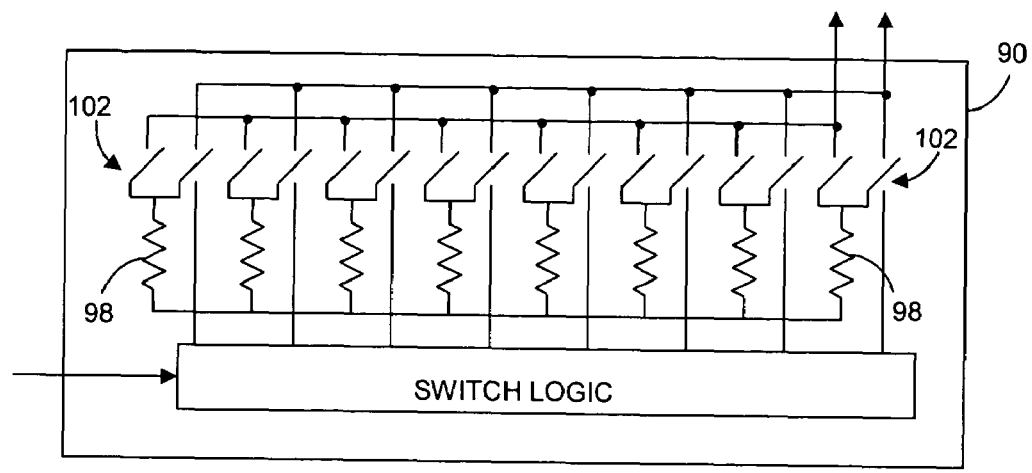
FIG. 7 is a schematic block diagram of the voltage source module of the PFD/DAC of FIG. 6 in accordance with the invention.

Another embodiment of the PFD/DAC 54 of FIG. 3 is illustrated in FIG. 6. The PFD/DAC 54' includes the same elements as the structure depicted in FIG. 4 except that the current source module 70 is replaced by a voltage source module 90 and the master charge pump 62 is replaced by a current switching module 94. FIG. 7 shows an embodiment of the voltage source module 90 which includes a plurality of resistive elements 98 coupled to respective switches 102 for selectively coupling to current switches in the current switching module 94.

Figure 8:
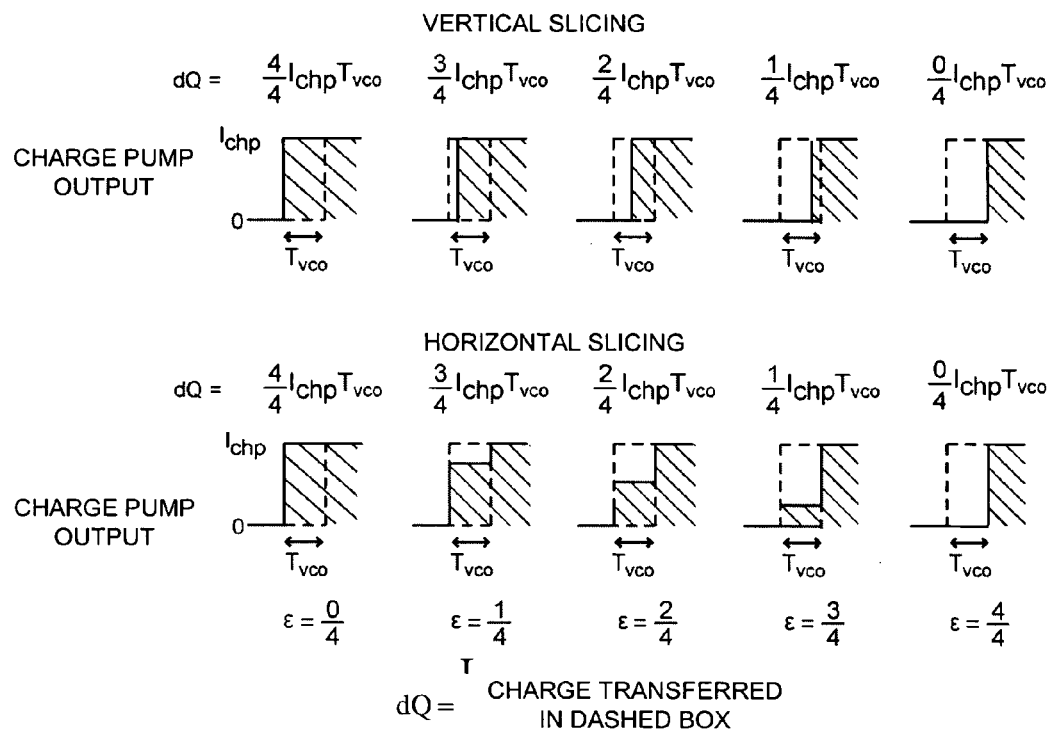
FIG. 8 is an illustration of some of the principles of reducing quantization step size according to horizontal slicing and vertical slicing techniques.

FIG. 8 illustrates the operation of a frequency synthesizer utilizing a PFD/DAC for "horizontal slicing" as compared to frequency synthesizers based on conventional multi-phase divider techniques used to reduce the quantization step size. The PFD/DAC can be implemented as illustrated in FIG. 4 or FIG. 6, or it may include any number of charge pumps configured for horizontal slicing. In the illustrated example the waveforms in the top row indicate the charge pump output current as a function of time for each phase of the conventional multi-phase divider having a quantization of one fourth of a VCO period $T_{vco}$. The waveforms in the bottom row represent the output of the PFD/DAC for the same quantization level. The variable $\epsilon$ corresponds to the phase error and is determined from the least significant bit (LSB) output of the accumulator 34. The dashed box represents the two possible values of charge pump current and the locations of a divider edge in a classical phase interpolation based frequency synthesizer having a quantization step size of one VCO period $T_{vco}$.

The "vertical slicing" illustrated in the top row corresponds to changing the amount of charge that is delivered inside the dashed box according to the acumulator residue $\epsilon$. The "horizontal slicing" illustrated in the bottom row achieves the same goal of reducing the quantization step size. However, instead of choosing different divider phases, the charge pump current is delivered in two phases. The residue $\epsilon$ controls how much current is delivered on the first phase and how much current is delivered on the second phase. The net charge inside the dashed box is the same for both vertical and horizontal slicing techniques. It is easier to increase resolution in a DAC by adding more unit elements than to resolve finer time steps in a multi-phase approach. Consequently, horizontal slicing achieves a higher resolution than vertical slicing and provides a greater reduction in broadband quantization-induced phase noise. Processing the phase error signal creasted by the charge pump in the same circuitry used to generate the cancellation signal with the DAC elements results in an inherent match between these signals.

The $\Sigma\Delta$ control signal for current "steering" can vary between zero and full-scale. De-biasing the current steering circuitry internal to the charge-pump 62 at either end of the range can be problematic for certain implementations of the current source and charge pump structure. According to an embodiment of a method for extending the range of a PFD/DAC, the register based delay module 74 is implemented as two registers in series, creating a total delay of two VCO periods. To maintain bias current in each current path, one fourth of the full scale current is directed to the $\Phi_0$ path and an identical current is directed to the $\Phi_1$ path. The remaining half of the full scale current is controlled by the DPM 56.

Figure 9:
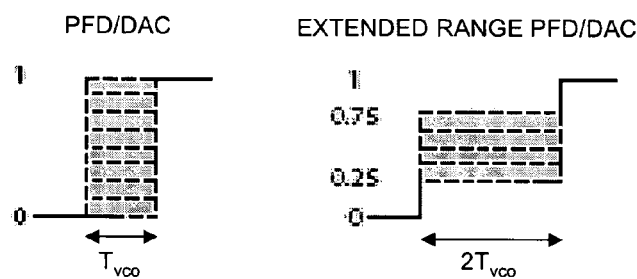
FIG. 9 is an illustration of the quantization step sizes for an embodiment of a method for extending the range of the horizontal slicing technique according to an embodiment of the invention.

FIG. 9 illustrates the extended range technique. The bias and $\Sigma\Delta$ controlled currents add so that a minimum of one fourth full-scale current is always present in each current steering path. The DAC unit elements (e.g., the current sources 82 of FIG. 5) that are summed to generate the one fourth full scale bias currents are shuffled in combination with the unit elements controlled by the DPM 56 to minimize the effect of mismatch. To achieve the same effective resolution, the number of unit elements required for extended range operation is twice the number of unit elements used in the PFD/DAC 54 without extend range. Thus an extra bit of full-scale resolution is used to obtain the same level of broadband noise reduction. In many extended range implementations of the PFD/DAC 54 (e.g., less than 10 bit implementations) the additional circuit area required to achieve the same effective resolution is acceptable due to the improvement in charge pump linearity and the reduction in design complexity.

Vertical slicing, as described above, reduces the divider phase quantization directly. Although the net charge enclosed by the dashed boxes of FIG. 8 is the same for vertical slicing and horizontal slicing, the shapes of the waveforms are different and the Fourier transforms of the waveforms differ. Although there is a good match between the phase error and cancellation signals at DC, gain error increases with increasing frequency and complete fractional spur cancellation cannot be achieved.

In one embodiment of a method for reducing phase noise in a fractional N frequency synthesizer according to the invention, a sample and hold circuit is used to sample the output of the master charge pump. The sampling frequency is the same as the reference frequency and sampling occurs at the end of a reference cycle, i.e., after the down current and up current to the charge pumps are completed. In one embodiment the reference frequency is an integer multiple of the sampling frequency. Thus the shape of the waveform during a sampling period has no effect on the output of the sample and hold circuit.

In another embodiment, the method for reducing phase noise in a fractional-N frequency synthesizer is based on compensation according to an approximation of the frequency-dependent error. More particularly, the difference between the Fourier transforms of the vertical slicing waveforms and the horizontal slicing waveforms is approximated. Using a Taylor series second order approximation, the difference $Q_{err}(j\omega)$ is given by $$Q_{err}(j\omega) \approx -\frac{j\omega}{2}\varepsilon(1-\varepsilon)$$

where $\varepsilon$ represents the residue generated by the accumulator 34.

Figure 10:
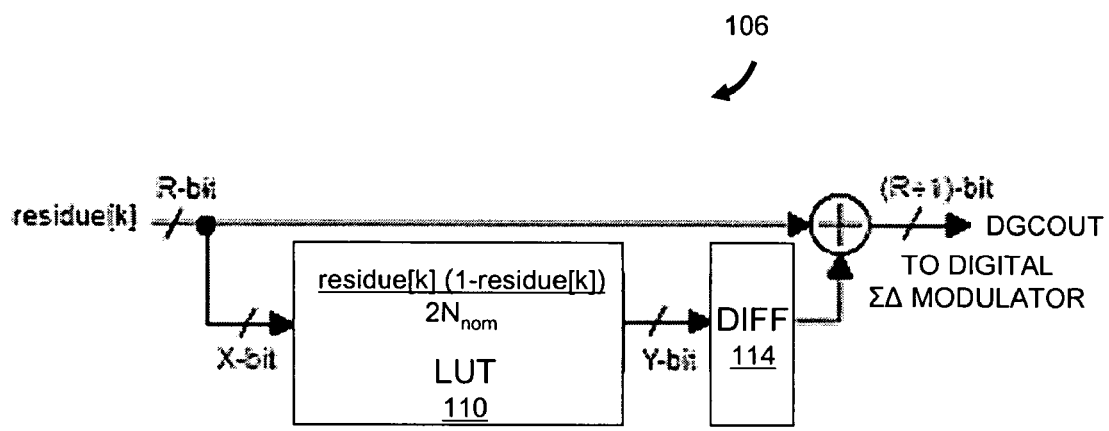
FIG. 10 is a functional block diagram of an embodiment of a digital gain compensation module according to the invention.

Referring to FIG. 10, a digital gain compensation module (DGC) 106 is integrated into the DPM 56 of FIG. 3. The DGC 106 implements the difference approximation method described above. A portion of the residue bits from the accumulator 34 are used to address a look up table (LUT) 110. The LUT 110 can be implemented as a read-only memory (ROM) module or random-access memory (RAM) module. In one embodiment the LUT 110 is a 1Kb ROM module. The output signal of the LUT 110 is processed by a discrete time differentiator 114 and summed with the residue signal residue[k]. The resulting signal DGCOUT is sent to the digital $\Sigma\Delta$ modulator for controlling the PFD/DAC 54.

The output DGCOUT of the DGC 106 is given by $$\frac{\text{residue}[k](1-\text{residue}[k])}{2N_{nom}}$$

where $N_{nom}$ represents the nominal divide value. Although the instantaneous divide value can be used instead for more accurate compensation, the nominal (static) divide value $N_{nom}$ is generally satisfactory if the approximation error is less than the desired level of compensation. If requirements necessitate higher accuracy, multiple LUTs 94 can be used to achieve an acceptable approximation error. In an alternative embodiment, a processor module performing real-time digital multiplication and division is used in place of the LUT 94.

Elements of the DAC portion of the PFD/DAC 54 are generally not matched. According to an embodiment of a method of reducing synthesizer noise in accordance with the invention, the utilization of elements of the DAC portion of the PFD/DAC 54 are varied to reduce the effect of the mismatched elements. For example, the magnitude of the current supplied by the current sources 82 in the current source module 70 of FIG. 5 can vary about a nominal value. To average out the effect of unequal current sources 82, the current sources 82 used to generate a particular current magnitude are varied. More specifically, the current source module 70 has eight current sources 82. If three of the current sources 82 are required to deliver current on the first phase $\Phi_0$, any three of the eight available current sources 82 can be switched to the first pump section 58' of the master charge pump 62. If a subsequent reference cycle requires the same current magnitude, a different three current sources 82, or a different combination of current sources 82, are used. In this way variations from the average current value supplied by a current source 82 are averaged to reduce the noise in the synthesized signal. This "shuffling" of the current sources 82 can be random or, alternatively, can be "assigned" in a circular or sequential manner to achieve the averaging effect. Importantly, this technique can also be applied to other PFD/DAC configurations. For instance, a PFD/DAC employing any number of charge pumps can shuffle or sequence through the activation of the charge pumps so that variations in their individual contributions are average out.

Signal skew inside the PFD/DAC 54 is another source of mismatch that can be compensated. Mismatch in the physical layout, loading, and device gradients results in a propagation delay difference between the $\Phi_0$ and $\Phi_1$ signal paths. Thus the time resolution is not generally equal to a VCO period. As a result of the timing mismatch, gain error and fractional spur feed-through are present. The compensation and resynchronization module 66 of FIG. 4 (and FIG. 6) reduces the effect of these noise sources.

Figure 11:
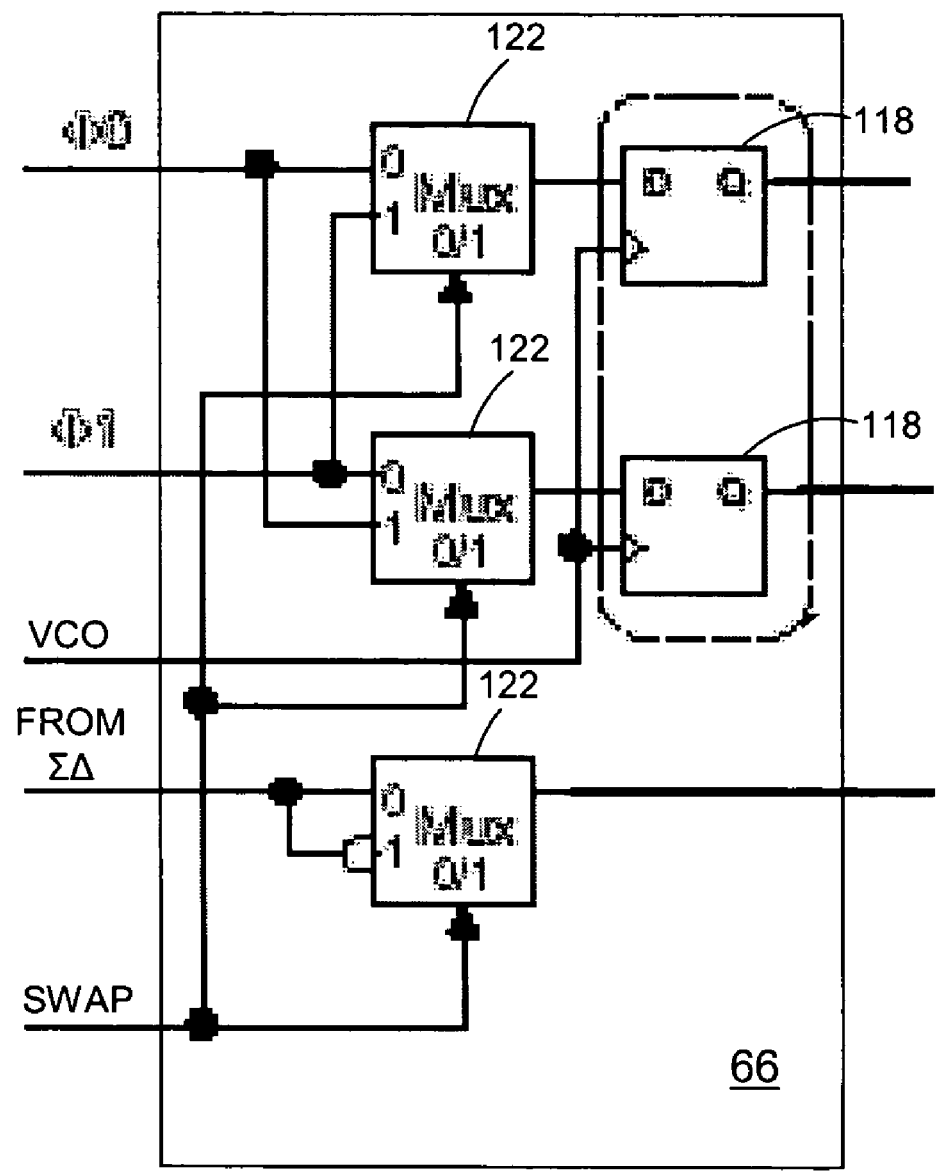
FIG. 11 is a schematic block diagram of an embodiment of a compensation and resynchronization module according to the invention.

FIG. 11 shows the compensation and resynchronization module 66 in more detail. A pair of re-timing flip-flops 118 is used to limit the skew between the two phase signal paths $\Phi_0$ and $\Phi_1$ to differences between the clock-to-Q times and propagation differences between the phase detector circuit paths. A phase swap signal SWAP toggles each of three multiplexers 122 so that on average a phase signal $\Phi_0$ or $\Phi_1$ controls each phase detector 14', 14" for an equal time. The current steering control bits from the $\Sigma\Delta$ modulator are selectively inverted to ensure correct operation. Because the re-timing flip-flops 118 reset the timing error, any remaining mismatch between the output signals of the two flip-flops 118 defines a single relative delay. This relative delay is shared equally between the two output signals if the duty cycle of the swap signal SWAP is set to 0.5. Thus the two phase signals experience the same average propagation time. Because this "swapping" technique is effectively results in a multiplication of the information in each phase signal path $\Phi_0$ and $\Phi_1$ and an error signal of amplitude between zero and the relative delay, the swap signal SWAP should be non-periodic to avoid to generation of mixing products. Moreover the swap signal SWAP should not include spurious energy. In one embodiment, each multiplexer 122 coupled to the phase signal paths $\Phi_0$, $\Phi_1$ is integrated with its corresponding flip-flop 118 and the SWAP signal is applied to the integrated device 118 to control selection of the two phase signal paths $\Phi_0$, $\Phi_1$. In another embodiment, a pseudo random linear feedback shift register is used to achieve a random spectrum for the swap signal SWAP. In another embodiment, a single bit output $\Sigma\Delta$ modulator is used to generate the random spectrum. Although the above description of a method for compensating for signal skew refers to the PFD/DAC 54 of FIG. 4, it should be recognized that the method is also applicable to compensating for signal skew between phase signals in other PFD/DAC configurations.

While the invention had been shown and described with reference to specific preferred embodiments, it should be understand by those skilled in the art that various changes in form and detail can be made therein without departing from the spirit and scope of the invention as defined by the following claims. For example, the methods for reducing phase noise can be applied to fractional-N frequency synthesizers based on horizontal slicing having any number of charge pumps.

What is claimed is:

1. A method for reducing the phase noise generated by relative propagation delay in a fractional-N frequency synthesizer having a first phase detector and a second phase detector, the method comprising:
   dividing a voltage controlled oscillator (VCO) signal by one of an integer and one more than the integer based on a predetermined fractional value;
   generating a first phase signal as a first current responsive to a phase error between a reference signal and the divided VCO signal;
   generating a second phase signal as a second current responsive to a phase error between the reference signal and a delayed divided VCO signal;
   generating a swap signal having a first state and a second state;
   providing the first phase signal to a first phase detector and a second phase signal to a second phase detector when the swap signal is in the first state;
   providing the first phase signal to the second phase detector and the second phase signal to the first phase detector when the swap signal is in the second state;
   generating a first sum current by adding a first predetermined bias current to the first current;
   generating a second sum current by adding a second predetermined bias current to the second current; and
   combining the first and second sum currents.

2. The method of claim 1 wherein the first and second predetermined bias currents are selected to extend the range of a PFD/DAC in the fractional-N frequency synthesizer.

3. The method of claim 2 wherein the PFD/DAC has a current range and at least one of the first and second predetermined bias currents has a magnitude of one-fourth of the current range.

4. The method of claim 1 wherein the first predetermined bias current and the second predetermined bias current are supplied from a same set of current sources in a current source module supplying current to a master charge pump.

5. The method of claim 1 wherein the fractional-N frequency synthesizer has a PFD/DAC, the method further comprising sampling a current generated in the PFD/DAC at a sampling rate substantially equal to a frequency of a reference signal used to determine a phase error, the sampling period being an integer number of reference cycles.

6. The method of claim 1 wherein the fractional-N frequency synthesizer has a PFD/DAC, the method further comprising:
   determining a number of DAC elements in the PFD/DAC to generate a DAC signal at a first quantization level;
   generating the DAC signal at the first quantization level using a first set of DAC elements; and
   generating the DAC signal at the first quantization level using a second set of DAC elements, the first set and the second set of DAC elements each having the predetermined number of DAC elements, the first set and the second set having different combinations of DAC elements.

7. The method of claim 6 wherein the first set and the second sets of DAC elements are determined according to a sequential assignment.

8. The method of claim 6 wherein the first set and the second sets of DAC elements are randomly determined.

9. The method of claim 1 wherein the delayed divided VCO signal is delayed in time from the divided VCO signal by twice a period of the VCO signal.

10. The method of claim 1 wherein the fractional-N frequency synthesizer has an accumulator, the method further comprising:
    determining a residue value generated by the accumulator;
    determining an approximation of a frequency-dependent gain error value; and
    summing the approximation of the frequency-dependent gain error value and the residue value to generate a digital control signal to control a PFD/DAC comprising the first and second phase detectors.

11. The method of claim 10 wherein the determination of the approximation of the frequency-dependent gain error value is given by $$\frac{\text{residue}[k](1 - \text{residue}[k])}{2N_{nom}}$$

where residue[k] represents the residue value generated by the accumulator for a reference cycle k and $N_{nom}$ represents a nominal divide value.

* * * * *